US010032859B2

(12) United States Patent
Moroz et al.

(10) Patent No.: US 10,032,859 B2
(45) Date of Patent: Jul. 24, 2018

(54) METHODS FOR MANUFACTURING INTEGRATED CIRCUIT DEVICES HAVING FEATURES WITH REDUCED EDGE CURVATURE

(71) Applicant: Synopsys, Inc., Mountain View, CA (US)

(72) Inventors: Victor Moroz, Saratoga, CA (US); Lars Bomholt, Feusisberg (CH)

(73) Assignee: Synopsys, Inc., Mountain View, CA (US)

( * ) Notice: Subject to any disclaimer, the term of this patent is extended or adjusted under 35 U.S.C. 154(b) by 181 days.

(21) Appl. No.: 15/192,651

(22) Filed: Jun. 24, 2016

(65) Prior Publication Data

US 2017/0025496 A1      Jan. 26, 2017

Related U.S. Application Data

(63) Continuation of application No. 14/869,733, filed on Sep. 29, 2015, now Pat. No. 9,379,183, which is a
(Continued)

(51) Int. Cl.
*H01L 29/04* (2006.01)
*H01L 21/306* (2006.01)
(Continued)

(52) U.S. Cl.
CPC ........ *H01L 29/045* (2013.01); *G06F 17/5045* (2013.01); *H01L 21/308* (2013.01);
(Continued)

(58) Field of Classification Search
CPC . H01L 29/045; H01L 29/0676; H01L 21/308; H01L 21/3065; H01L 21/30608; G06F 17/5045

See application file for complete search history.

(56) References Cited

U.S. PATENT DOCUMENTS 3,765,969 A    10/1973  Kragness et al.
4,882,294 A    11/1989  Christenson
(Continued)

FOREIGN PATENT DOCUMENTS

CN    102117737 A     7/2011
JP    2007-324384 A   12/2007
(Continued)

OTHER PUBLICATIONS

TW 105105645—First Office Action dated Nov. 3, 2016, 6 pages.
(Continued)

*Primary Examiner* — Naum B Levin
(74) *Attorney, Agent, or Firm* — Haynes Beffel & Wolfeld LLP

(57) ABSTRACT

A structure, such as an integrated circuit device, is described that includes a line of material with critical dimensions which vary within a distribution substantially less than that of a mask element, such as a patterned resist element, used in etching the line. Techniques are described for processing a line of crystalline phase material which has already been etched using the mask element, in a manner which straightens an etched sidewall surface of the line. The straightened sidewall surface does not carry the sidewall surface variations introduced by photolithographic processes, or other patterning processes, involved in forming the mask element and etching the line.

46 Claims, 13 Drawing Sheets

Related U.S. Application Data continuation of application No. 14/201,584, filed on Mar. 7, 2014, now Pat. No. 9,152,750, which is a continuation of application No. PCT/US2012/054224, filed on Sep. 7, 2012, which is a continuation of application No. 13/350,523, filed on Jan. 13, 2012, now Pat. No. 8,609,550.

(60) Provisional application No. 61/532,475, filed on Sep. 8, 2011.

(51) Int. Cl.
    *H01L 21/3065* (2006.01)
    *G06F 17/50* (2006.01)
    *H01L 29/06* (2006.01)
    *H01L 21/308* (2006.01)

(52) U.S. Cl.
    CPC .... *H01L 21/3065* (2013.01); *H01L 21/30608* (2013.01); *H01L 29/0676* (2013.01)

(56) References Cited

U.S. PATENT DOCUMENTS

| | | | |
|---|---|---|---|
| 5,641,380 A | | 6/1997 | Yamazaki et al. |
| 5,810,923 A | | 9/1998 | Yano et al. |
| 6,137,136 A | | 10/2000 | Yahata et al. |
| 6,376,339 B2 | | 4/2002 | Linthicum et al. |
| 6,482,742 B1 | * | 11/2002 | Chou ............... B29C 43/003 264/293 |
| 6,656,271 B2 | | 12/2003 | Yonehara et al. |
| 6,960,781 B2 | | 11/2005 | Currie et al. |
| 7,029,977 B2 | | 4/2006 | Kishimoto et al. |
| 7,038,249 B2 | | 5/2006 | Suligoj et al. |
| 7,123,805 B2 | | 10/2006 | Sparacin et al. |
| 7,326,969 B1 | | 2/2008 | Horch |
| 7,335,908 B2 | | 2/2008 | Samuelson et al. |
| 7,387,944 B2 | | 6/2008 | Tong et al. |
| 7,411,274 B2 | | 8/2008 | Yamanaka et al. |
| 7,459,363 B2 | | 12/2008 | Subramanian |
| 7,540,970 B2 | | 6/2009 | Koh et al. |
| 7,547,637 B2 | | 6/2009 | Brask et al. |
| 7,788,818 B1 | | 9/2010 | Tran et al. |
| 7,799,699 B2 | | 9/2010 | Nuzzo et al. |
| 7,827,519 B2 | | 11/2010 | Scheffer et al. |
| 7,831,123 B2 | | 11/2010 | Sparacin et al. |
| 7,851,252 B2 | * | 12/2010 | Nealey ............... B82Y 10/00 257/40 |
| 7,932,123 B2 | | 4/2011 | Rogers et al. |
| 7,977,766 B2 | | 7/2011 | Booth, Jr. et al. |
| 8,026,180 B2 | | 9/2011 | Greeley et al. |
| 8,030,108 B1 | * | 10/2011 | Lee ............... B82Y 10/00 257/E21.09 |
| 8,084,825 B2 | | 12/2011 | Fuller et al. |
| 8,241,977 B2 | | 8/2012 | Scheiper et al. |
| 8,455,159 B2 | | 6/2013 | Ryu |
| 8,492,068 B2 | * | 7/2013 | Bae ............... G03F 7/0035 430/270.1 |
| 8,545,710 B2 | | 10/2013 | Kuboi et al. |
| 8,609,550 B2 | | 12/2013 | Moroz et al. |
| 8,617,799 B2 | * | 12/2013 | Koefer ............... G02B 3/0018 430/321 |
| 8,822,248 B2 | | 9/2014 | Park |
| 9,064,808 B2 | | 6/2015 | Moroz et al. |
| 9,152,750 B2 | | 10/2015 | Moroz et al. |
| 9,379,183 B2 | | 6/2016 | Moroz et al. |
| 2003/0047129 A1 | | 3/2003 | Kawahara et al. |
| 2003/0094674 A1 | | 5/2003 | Ipposhi et al. |
| 2003/0098292 A1 | | 5/2003 | Kulkarni |
| 2003/0177975 A1 | | 9/2003 | Ikesue et al. |
| 2005/0067630 A1 | * | 3/2005 | Zhao ............... H01L 29/1066 257/134 |
| 2005/0116290 A1 | | 6/2005 | de Souza et al. |
| 2005/0205859 A1 | | 9/2005 | Currie et al. |
| 2006/0131553 A1 | | 6/2006 | Yamanaka et al. |
| 2006/0228847 A1 | | 10/2006 | Liu et al. |
| 2006/0267088 A1 | * | 11/2006 | Sharp ............... H01L 29/66727 257/341 |
| 2007/0015371 A1 | | 1/2007 | Olynick et al. |
| 2007/0029643 A1 | * | 2/2007 | Johnson ............... B81C 1/00111 257/651 |
| 2007/0032089 A1 | | 2/2007 | Nuzzo et al. |
| 2007/0099404 A1 | | 5/2007 | Govindaraju et al. |
| 2007/0259467 A1 | | 11/2007 | Tweet et al. |
| 2008/0108171 A1 | | 5/2008 | Rogers et al. |
| 2008/0121882 A1 | | 5/2008 | Hwang et al. |
| 2008/0163139 A1 | | 7/2008 | Scheffer et al. |
| 2008/0182419 A1 | | 7/2008 | Yasui et al. |
| 2008/0253728 A1 | | 10/2008 | Sparacin et al. |
| 2008/0257409 A1 | | 10/2008 | Li et al. |
| 2008/0267239 A1 | | 10/2008 | Hall et al. |
| 2008/0305437 A1 | | 12/2008 | Fuller et al. |
| 2009/0011566 A1 | | 1/2009 | Okada et al. |
| 2009/0017627 A1 | * | 1/2009 | Greeley ............... H01L 21/0337 438/697 |
| 2009/0032873 A1 | | 2/2009 | Cites et al. |
| 2009/0115094 A1 | * | 5/2009 | Chou ............... B01L 3/502707 264/219 |
| 2009/0206054 A1 | * | 8/2009 | Nealey ............... B82Y 10/00 216/49 |
| 2009/0309160 A1 | | 12/2009 | Cohen et al. |
| 2010/0048027 A1 | | 2/2010 | Cheng et al. |
| 2010/0193860 A1 | | 8/2010 | Scheiper et al. |
| 2010/0197088 A1 | | 8/2010 | Sakuma et al. |
| 2010/0219505 A1 | | 9/2010 | D'Evelyn |
| 2011/0104875 A1 | | 5/2011 | Wojtczak et al. |
| 2011/0159699 A1 | | 6/2011 | Gabriel |
| 2011/0291188 A1 | | 12/2011 | Cheng et al. |
| 2012/0043623 A1 | | 2/2012 | Doris et al. |
| 2012/0061349 A1 | | 3/2012 | Ryu |
| 2012/0103939 A1 | | 5/2012 | Wu et al. |
| 2012/0202333 A1 | | 8/2012 | Breitwisch et al. |
| 2013/0026607 A1 | | 1/2013 | Moroz et al. |
| 2013/0037857 A1 | | 2/2013 | Von Kanel et al. |
| 2013/0298977 A1 | * | 11/2013 | Chen ............... B82Y 30/00 136/255 |
| 2014/0223394 A1 | | 8/2014 | Moroz et al. |

FOREIGN PATENT DOCUMENTS

| | | |
|---|---|---|
| KR | 2005-0118435 A | 12/2005 |
| KR | 10-0843043 B1 | 7/2008 |
| KR | 2008-0114158 A | 12/2008 |
| KR | 10-0918864 B1 | 9/2009 |
| TW | 540117 B | 7/2003 |
| TW | 200836083 A | 9/2008 |
| TW | 200952040 A | 12/2009 |
| TW | 201020685 A | 6/2010 |
| TW | 201100946 A | 1/2011 |
| WO | 0033365 A1 | 6/2000 |

OTHER PUBLICATIONS

U.S. Appl. No. 13/190,319—Advisory Action dated Nov. 29, 2013, 4 pages.

U.S. Appl. No. 14/748,091—Response to Office Action dated Nov. 17, 2015 filed Feb. 2, 2016, 5 pages.

U.S. Appl. No. 14/748,091—Response to Final Office Action dated Mar. 29, 2016 filed May 13, 2016, 14 pages.

Yu et al., "Investigation of Nanowire Line-Edge Roughness in Gate-All-Around Silicon Nanowire MOSFETs," IEEE Transactions on Electron Devices, vol. 57, No. 11, Nov. 2010, 8 pages.

Soda et al., "Reduction effect of line edge roughness on time-dependent dielectric breakdown lifetime of Cu/low-k nterconnects by using CF3I etching," J. Vac. Sci. Technol. B 27(2), Mar./Apr. 2009, pp. 649-653.

Soda et al., "Mechanism of reducing line edge roughness in ArF photoresist by using CF3I plasma," J. Vac. Sci. Technol. B 27(5), Sep./Oct. 2009, pp. 2217-2123.

(56) References Cited

OTHER PUBLICATIONS

Naulleau et al., "System-level line-edge roughness limits in extreme ultraviolet lithography," J. Vac. Sci. Technol. B 26 (4), Jul./Aug. 2008, pp. 1289-1293.
Pargon et al., "Linewidth roughness transfer measured by critical dimension atomic force microscopy during plasma patterning of polysilicon gate transistors," J. Vac. Sci. Technol. B (26)3, May/Jun. 2008, pp. 1011-1020.
U.S. Appl. No. 14/748,091—Final Office Action dated Feb. 21, 2017, 18 pages.
PCT/US12/47431—Written Opinion dated Jan. 28, 2013, 5 pages.
PCT/US12/47431—International Preliminary Report on Patentability dated Jan. 28, 2014, 6 pages.
U.S. Appl. No. 14/748,091—Response to Advisory Action dated Jun. 22, 2016, filed Aug. 24, 2016, 6 pages.
U.S. Appl. No. 14/748,091—Response to Office Action dated Sep. 15, 2016, filed Jan. 13, 2017, 17 pages.
PCT/US12/54224—International Preliminary Report on Patentability dated Mar. 12, 2014, 8 pages.
CN 2012800477749—Voluntary Amendment filed Sep. 22, 2014, 18 pages.
EP 12829654.8—Response to Search Report dated Jan. 28, 2016, filed Aug. 26, 2016, 18 pages.
TW 105105645—Response to First Office Action dated Nov. 3, 2016, filed Jan. 19, 2017, 7 pages.
KR 2014-7008640—Third Office Action (Appeal Decision) dated Dec. 26, 2016, 18 pages.
U.S. Appl. No. 14/748,091—Response to Final Office Action dated Feb. 21, 2017 filed Apr. 11, 2017, 7 pages.
U.S. Appl. No. 14/748,091—Notice of Allowance dated Apr. 27, 2017, 12 pages.
TW 105105645—Notice of Allowance dated Apr. 12, 2017, 2 pages.
Fried et al., "Comparison study of FinFETs: SOI vs. Bulk," SOI Industry Consortium, Press Release Oct. 21, 2009, 19 pages, http://www.soiconsortium.org/news-events/the-soi-industry-consortium-announces-results-of-a-soi-and-bulk-finfets-comparison-study-24.php.
Yahata et al., "Smoothing of Si Trench Sidewall Surface by Chemical Dry Etching and Sacrificial Oxidation," Jpn. J. Appl. Phys. vol. 37, (1998), pp. 3954-3955.
U.S. Appl. No. 13/190,319—Final Office Action dated Jun. 19, 2013.
TW 101132748—Response to Office Action dated Jul. 9, 2015 filed Sep. 1, 2015, 29 pages.
TW 101132748—Office Action dated Jul. 9, 2015 with English translation, 4 pages.
Tezuka T et al: "Observation of Mobility Enhancement in Strained Si and SiGe Tri-Gate MOSFETS with Multi-Nanowire Channels Trimmed by Hydrogen Thermal Etching", 2007 IEEE Intl. Electron Devices Meeting: Washington, DC, Dec. 10-12, 2007, pp. 887-890.
U.S. Appl. No. 14/748,091—Office Action dated Sep. 15, 2016, 15 pages.
CN 2012800477749—Response to Second Office Action dated Jul. 12, 2016 filed Sep. 20, 2016, 14 pages.
CN 2012800477749—Notice of Allowance dated Nov. 2, 2016, 2 pages.
Martin-Bragado, I. et al., "Facet formation during Solid Phase Epitaxy Regrowth: A Lattice Kinetic Monte Carlo model," Nanoscale Science and Design, Appl. Phys. Lett. 95:12,123123, 2009, 3pp.
Martin-Bragado, I. et al., "Modeling of {311} facets using a lattice kinetic Monte Carlo three-dimensional model for selective epitaxial growth of silicon," Nanoscale Science and Design, Appl. Phys. Lett. 98:15,153111, 2011, 3pp.
"Wet-Chemical Etching and Cleaning of Silicon," Technology Notes #7, VSI Technology Library, Virginia Semiconductor Inc., www. virginiasemi.com, 2003, 11pp.
Wada, H., "UV Nanoimprint Technology for sub-25nm Half-Pitch Semiconductor Device Manufacturing," Molecular Imprints 2010 Int'l Symp. Lithography Extensions, 20 slides.

U.S. Appl. No. 13/190,319—Office Action dated Jan. 17, 2013, 16 pages.
PCT/US12/47431—International Search Report dated Jan. 28, 2013, 10 pages.
PCT/US12/54224—International Search Report dated Mar. 4, 2013, 12 pages.
U.S. Appl. No. 13/190,319—Response B filed Apr. 17, 2013, 8 pages.
Mistry et al. "A 45nm Logic Technology with High-k+ Metal Gate Transistors, Strained Silicon, 9 Cu Interconnect Layers, 193nm Dry Patterning, and 100% Pb-free Packaging," Electron Devices Meeting, IEDM 2007, IEEE International, Dec. 10-12, 2007, 4 pages.
Moroz et al., "Options at the 45nm Node Include Engineered Substrates," Solid State Technology, Jul. 2005, 4 pages.
U.S. Appl. No. 13/190,319—Office Action dated Jul. 17, 2014, 18 pages.
U.S. Appl. No. 14/201,584—Office Action dated Sep. 30, 2014, 13 pages.
TW 101132748—Office Action dated Oct. 21, 2014, 12 pages.
U.S. Appl. No. 14/201,584—Office Action dated Jan. 23, 2015, 8 pages.
TW 101126042—Office Action dated Jan. 29, 2015, 17 pages.
U.S. Appl. No. 13/190,319—Notice of Allowance dated Feb. 17, 2015, 20 pages.
U.S. Appl. No. 14/201,584—Notice of Allowance dated Jun. 2, 2015, 9 pages.
U.S. Appl. No. 13/350,523—Notice of Allowance dated Aug. 14, 2013, 18 pages.
U.S. Appl. No. 14/201,584—Response to Office Action dated Jan. 23, 2015, filed May 20, 2015, 9 pages.
U.S. Appl. No. 14/201,584—Response to Office Action dated Sep. 30, 2014, filed Dec. 29, 2014, 6 pages.
TW 101132748<Response to Office Action dated Oct. 21, 2014, filed Jan. 21, 2015, 40 pages.
U.S. Appl. No. 13/190,319—Response C to Final Office Action dated Jun. 19, 2013 filed Nov. 19, 2013, 10 pages.
U.S. Appl. No. 13/190,319—Response D to Office Action dated Jul. 17, 2014 filed Jan. 20, 2015, 16 pages.
TW 101126042—Response to Office Action dated Jan. 29, 2015 filed Apr. 28, 2015, 22 pages.
TW 101126042—Office Action dated Jun. 29, 2015, 12 pages.
EP 12829654—Supplemental Partial European Search Report dated Jul. 6, 2015, 7 pages.
Kalburge, A., et al. "Focused ion beam assisted chemically etched mesas on GaAs (001) and the nature of subsequent molecular beam epitaxial growth." Journal of applied physics 82.2, Jul. 15, 1997, pp. 859-864.
Wang, et al. "The morphology of InPInGaAs grown by molecular beam epitaxy onto V-grooved InP substrates." Journal of crystal growth 173.3 (1997), pp. 307-314.
Juan et al., "Controlling sidewall smoothness for micromachined Si mirrors and lenses." Journal of Vacuum Science & Technology B 14.6 (1996), pp. 4080-4084.
KR 2014-7008640—Office Action dated Jul. 20, 2015, 12 pages.
TW 101126042—Response to Office Action dated Jun. 29, 2015 filed Aug. 31, 2015, 21 pages.
KR 2014-7008640—Response to Office Action dated Jul. 20, 2015 filed Sep. 21, 2015, 70 pages.
U.S. Appl. No. 14/748,091—Office Action dated Nov. 17, 2015, 20 pages.
U.S. Appl. No. 14/869,733—Office Action dated Jan. 25, 2016, 16 pages.
CN 2012800477749—First Office Action dated Nov. 5, 2015, 20 pages.
EP 12829654.8—Search Report dated Jan. 28, 2016, 17 pages.
Nilsson D et al "Fabrication of silicon molds for polymer optics", Journal of Micromechanics & Microengineering, Instititue of Physics Publishing, Bristol, GB, vol. 13, No. 4, Jul. 1, 2003, pp. S57-S61.
Schuler H et al: "In situ etching and regrowth in III-V molecular beam epitaxy for future nanotechnology", Journal of Vacuum Sci-

(56) References Cited

OTHER PUBLICATIONS ence & Technology B: Microelectronicsprocessing and Phenomena, American Vacuum Society, NY, NY, US, vol. 18, No. 3, May 1, 2000, pp. 1557-1561.
Shikida M et al: "The mechanism of selective corrugation removal by KOH anisotropic wet etching", Journal of Micromechanics & Microengineering, Institute of Physics Publishing, Bristol, GB, vol. 20, No. 1, Jan. 1, 2010, p. 15038.
TW 101132748—Notice of Allowance dated Jan. 25, 2016, 2 pages.
KR 2014-7008640—Second Office Action (Final Rejection) dated Jan. 25, 2016, 8 pages.
U.S. Appl. No. 14/869,733—Response to Office Action dated Jan. 25, 2016 filed Feb. 3, 2016, 5 pages.
U.S. Appl. No. 14/869,733—Notice of Allowance dated Mar. 1, 2016, 10 pages.
U.S. Appl. No. 14/748,091—Final Office Action dated Mar. 29, 2016, 9 pages.
KR 2014-7008640—Response to Second Office Action (Final Rejection) dated Jan. 25, 2016, 22 pages.
U.S. Appl. No. 14/748,091—Advisory Action dated Jun. 22, 2016, 5 pages.
TW 101126042—Notice of Allowance dated Jun. 27, 2016, 2 pages.
CN 2012800477749—Second Office Action dated Jul. 12, 2016, 6 pages.
CN 2012800477749—Response to First Office Action dated Nov. 5, 2015 filed Mar. 21, 2016, 17 pages.
EP 12829654.8—First Office Action dated Jul. 4, 2017, 5 pages.
KR 2016-7009990—Request for Examination and Amendment filed Sep. 4, 2017, 55 pages.
KR 2016-7009990—First Office Action dated Nov. 13, 2017, 12 pages.
KR 2016-7009990—Response to First Office Action dated Nov. 13, 2017 filed Jan. 11, 2018, 78 pages.
EP 12829654.8—Response to First Office Action dated Jul. 4, 2017, filed Nov. 7, 2017, 10 pages.

\* cited by examiner

METHODS FOR MANUFACTURING INTEGRATED CIRCUIT DEVICES HAVING FEATURES WITH REDUCED EDGE CURVATURE

CROSS-REFERENCE TO RELATED APPLICATIONS

This application is a Continuation of U.S. application Ser. No. 14/869,733 filed 29 Sep. 2015, entitled "METHODS FOR MANUFACTURING INTEGRATED CIRCUIT DEVICES HAVING FEATURES WITH REDUCED EDGE CURVATURE," by Victor Moroz and Lars Bomholt, now U.S. Pat. No. 9,379,183, issued 28 Jun. 2016, which application is a Continuation of U.S. application Ser. No. 14/201,584 filed 7 Mar. 2014, entitled "METHODS FOR MANUFACTURING INTEGRATED CIRCUIT DEVICES HAVING FEATURES WITH REDUCED EDGE CURVATURE," by Victor Moroz and Lars Bomholt, now U.S. Pat. No. 9,152,750, issued 6 Oct. 2015, which application is a Continuation of PCT International Application No. PCT/US12/54224, entitled "METHODS FOR MANUFACTURING INTEGRATED CIRCUIT DEVICES HAVING FEATURES WITH REDUCED EDGE CURVATURE," by Victor Moroz and Lars Bomholt, filed 7 Sep. 2012, which application claims the benefit of U.S. patent application Ser. No. 13/350,523, entitled "METHODS FOR MANUFACTURING INTEGRATED CIRCUIT DEVICES HAVING FEATURES WITH REDUCED EDGE CURVATURE," by Victor Moroz and Lars Bomholt, filed 13 Jan. 2012, now U.S. Pat. No. 8,609,550, issued 17 Dec. 2013, which application is a non-provisional of U.S. Provisional Application No. 61/532,475 entitled "CRYSTAL SELF-ASSEMBLY APPLIED TO FEATURE PATTERNING," by Victor Moroz and Lars Bomholt, filed 8 Sep. 2011. All the above applications are incorporated herein by reference.

BACKGROUND

Field of the Invention

The present invention relates to integrated circuit fabrication, and more particularly to methods for fabricating high-density integrated circuit devices.

Description of Related Art

Photolithographic processes can be used to form a variety of integrated circuit structures on a semiconductor wafer. In photolithography, features of these structures are typically created by exposing a mask pattern (or reticle) to project an image onto a wafer that is coated with light sensitive material such as photo resist. After exposure, the pattern formed in the photo resist may then be transferred to an underlying layer (e.g. metal, polysilicon, etc.) through etching, thereby creating the desired features.

One problem associated with manufacturing devices having very small features arises because of variations introduced by the photolithographic processes. Specifically, resist material properties, process conditions, optical distortions and other factors can cause systematic and random deviations in the etched shapes of the features from their desired shapes. Examples of deviations include corner-rounding, line-shortening and line edge roughness.

In a typical lithographic patterning process, a line of resist is used as an etch mask to create a corresponding line of material in the underlying layer. In such a case, the deviations in the patterned line of resist will be transferred to the critical dimensions of the etched line in the underlying layer. As process technologies continue to shrink, these deviations become a greater percentage of the critical dimension of the etched lines, which can reduce yield and result in significant performance variability in devices such as transistors implemented utilizing these etched lines.

Accordingly, it is desirable to provide high-density structures such as integrated circuit devices which overcome or alleviate issues caused by deviations introduced by photolithographic processes, thereby improving performance and manufacturing yield of such devices.

SUMMARY

A structure, such as an integrated circuit device, is described that includes a line of material with critical dimensions which vary within a distribution substantially less than that of a mask element, such as a patterned resist element, used in etching the line. Techniques are described for processing a line of crystalline phase material which has already been etched using the mask element by utilizing anisotropic properties of the material, in a manner which straightens an etched sidewall surface of the line. The straightened sidewall surface does not carry the sidewall surface variations introduced by photolithographic processes, or other patterning processes, involved in forming the mask element and etching the line.

In one embodiment, the etched sidewall surface of the line extends along a surface generally parallel to a particular crystal plane of the layer's crystal lattice which has a relatively slow epitaxial growth rate. The etched sidewall surface is then straightened by performing an epitaxial process to grow crystalline phase material at energetically favorable step or kink sites which define the roughness of the etched sidewall surface. During the epitaxial growth process, atoms are more likely to bond at these energetically favorable sites, as compared to an already flat crystal surface along the particular crystal plane. This tends to advance crystalline growth along the particular plane, which in turn causes the straightening of the sidewall surface.

In another embodiment, the etched sidewall surface of the line extends along a surface generally parallel to a particular crystal plane of the layer's crystal lattice which has a relatively slow etch rate for a subsequent etching process. The etched sidewall surface is then straightened by performing the subsequent etching process. During the subsequent etching process, atoms are more rapidly removed at step or kink sites which define the roughness of the etched sidewall surface, as compared to removal of atoms on an already flat crystal surface along the particular crystal plane. This in turn causes the straightening of the sidewall surface along the particular crystal plane.

As a result of these techniques, the variation in the straightened sidewall surface can be controlled much tighter than the variation in the sidewall surface of the mask element used in etching the line. This results in the line of material having improved line definition, with straighter edges and sharper corners, than can be obtained using conventional lithographic etch mask techniques. In embodiments of the technology described herein, the line edge roughness of the straightened line of material is less than or equal to 1 nm, which is much less than is possible utilizing conventional techniques.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Other aspects and advantages of the present invention can be seen on review of the drawings, the detailed description, and the claims which follow.

DETAILED DESCRIPTION

The following description is presented to enable any person skilled in the art to make and use the invention, and is provided in the context of a particular application and its requirements. Various modifications to the disclosed embodiment will be readily apparent to those skilled in the art, and the general principles defined herein may be applied to other embodiments and applications without departing from the spirit and scope of the present invention. Thus, the present invention is not intended to be limited to the embodiments shown, but is to be accorded with the widest scope consistent with the principles and features disclosed herein.

FIGS. 1-4 illustrate stages in a manufacturing process flow of an embodiment for straightening an etched sidewall surface of a line of crystalline phase material. It will be understood that the process steps and structures described with reference to FIGS. 1-4 do not describe a complete process for the manufacturing of an integrated circuit device. The processes described herein can be utilized in the manufacturing of various types of integrated circuit components.

Figure 1A:
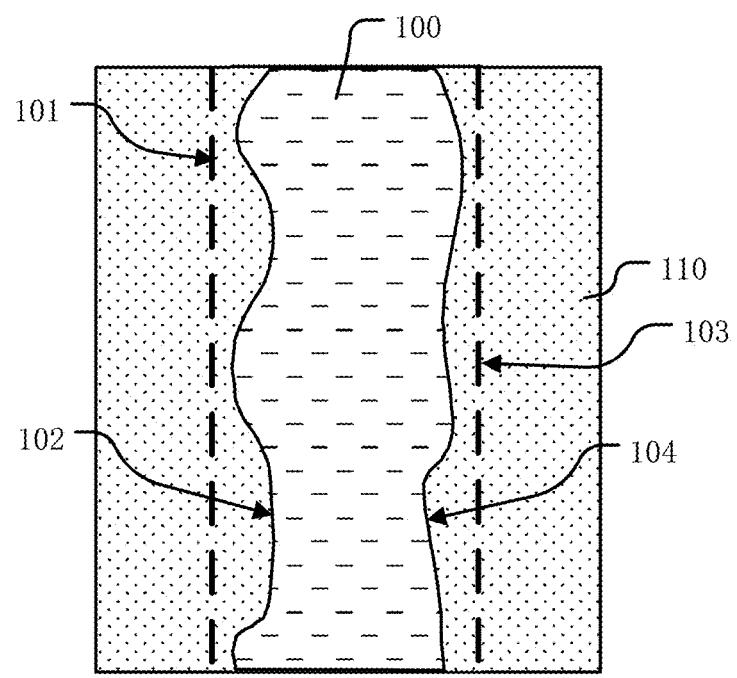
FIGS. 1A, 1B, 2A, 2B, 3A, 3B, 4A, and 4B illustrate stages in a manufacturing process flow of an embodiment for straightening an etched sidewall surface of a line of crystalline phase material.
Figure 1B:
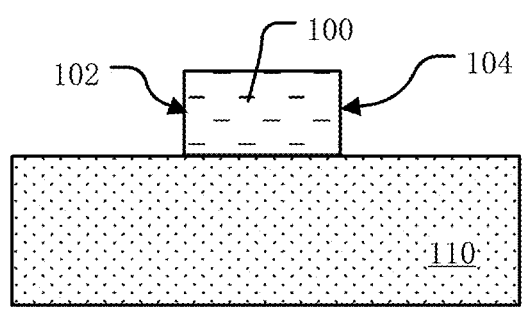

FIGS. 1A and 1B (collectively "FIG. 1") illustrate top and cross-sectional views respectively of a mask element 100 patterned on a material layer 110. The mask element 100 has a sidewall surface 102 and a sidewall surface 104. The mask element 100 may be formed by patterning a layer of photoresist using a lithographic process. For example, the mask element 100 may be formed for example using 193 nm lithography, extreme ultraviolet (EUV) radiation, electron beams, nanoimprint lithography, spacer lithography, or double patterning. Alternatively, other materials and patterning processes may be used to form the mask element 100.

The material layer 110 is a layer of crystalline phase material. As described in more detail below, the material layer 110 is a material with a crystal lattice having at least one crystal plane which has a relatively slow epitaxial growth rate. The material layer 110 may for example comprise silicon or other semiconductor material. Alternatively, the material layer 110 may comprise other materials. In some embodiments, the material layer 110 may be an intermediate layer between an underlying layer and the mask element 100.

The mask element 100 has variations in shape as a result of imperfections and pattern fidelity limitations during the formation of the mask element 100. The dashed lines 101, 103 in the top view of FIG. 1A represent an idealized shape of the mask element 100. The term "line edge roughness" (LER) refers to a statistical measure, such as the standard deviation, of the actual positions of a sidewall surface relative to the mean sidewall surface position along the length of a segment of the sidewall surface. The values of LER described herein refer to a three-sigma standard deviation of the roughness of the sidewall surface, unless indicated otherwise. The term "line width roughness" (LWR) refers to a statistical measure, such as the standard deviation, of the actual line width relative to the mean line width along the length of a segment of a line having two sidewall surfaces. The values of LWR described herein refer to a three-sigma standard deviation of the roughness of the width, unless indicated otherwise.

As can be seen in FIGS. 1A and 1B, the first sidewall surface 102 and the second sidewall surface 104 each have a pronounced LER. Accordingly, the mask element 100 has a pronounced LWR.

Figure 2A:
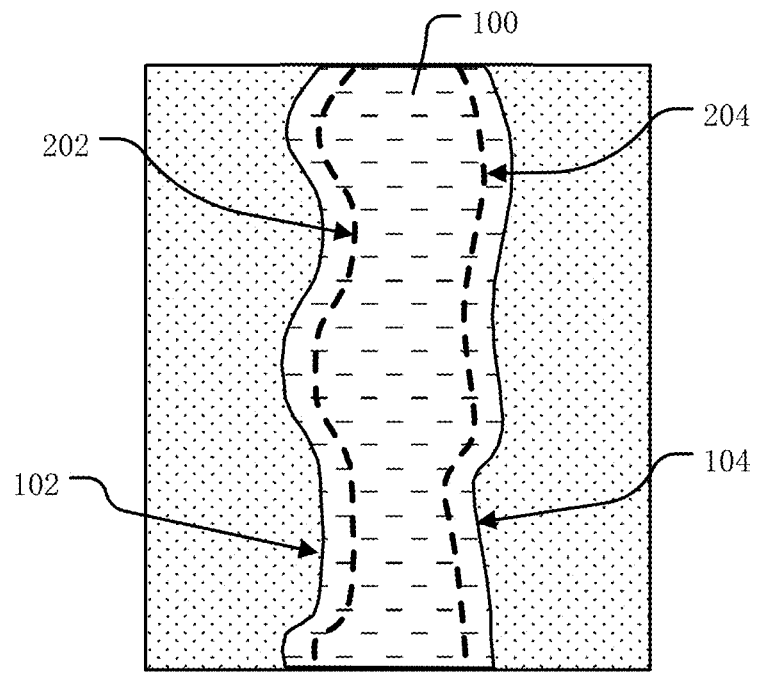
Figure 2B:
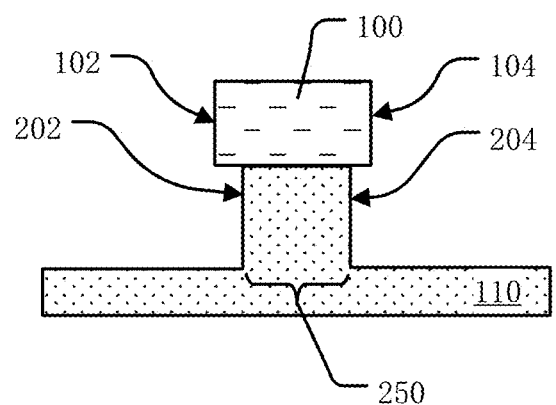

Next, an etching process is performed on the structure illustrated in FIGS. 1A and 1B using the mask element 100 as an etch mask, resulting in the structure illustrated in the top and cross sectional views of FIGS. 2A and 2B (collectively "FIG. 2"). The etch process used depends on the material of the material layer 110, and can vary from embodiment to embodiment. In one embodiment in which the material layer 110 is silicon, the etching process is performed using reactive ion etching.

The etching process forms an etched sidewall surface 202 in the material layer 110 at a location defined by the sidewall surface 102 of the mask element 100. Similarly, the etching process forms an etched sidewall surface 204 in the material layer 110 at a location defined by the sidewall surface 104 of the mask element 100. The sidewall surface 202 and the sidewall surface 204 define opposing sides of a line 250 of crystalline phase material in the material layer 110.

As shown in FIGS. 2A and 2B, the variation in the respective sidewall surfaces 102, 104 of the mask element 100 are carried through to the sidewall surfaces 202, 204 in the material layer 110. Due to undercutting by the etching process, the sidewall surfaces 202, 204 each extend a distance beneath the mask element 100 to define the line 250.

Figure 3A:
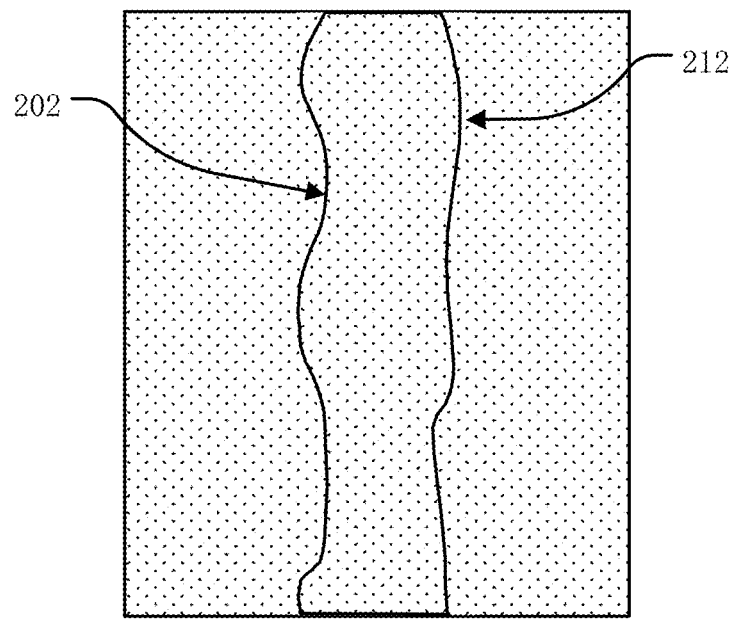
Figure 3B:
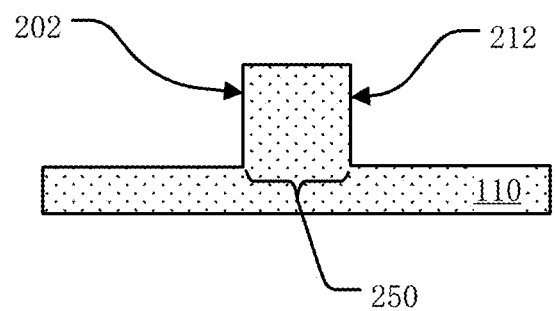

Next, the mask element 100 is removed, resulting in the structure illustrated in the top and cross-sectional views of FIGS. 3A and 3B (collectively "FIG. 3").

Figure 4A:
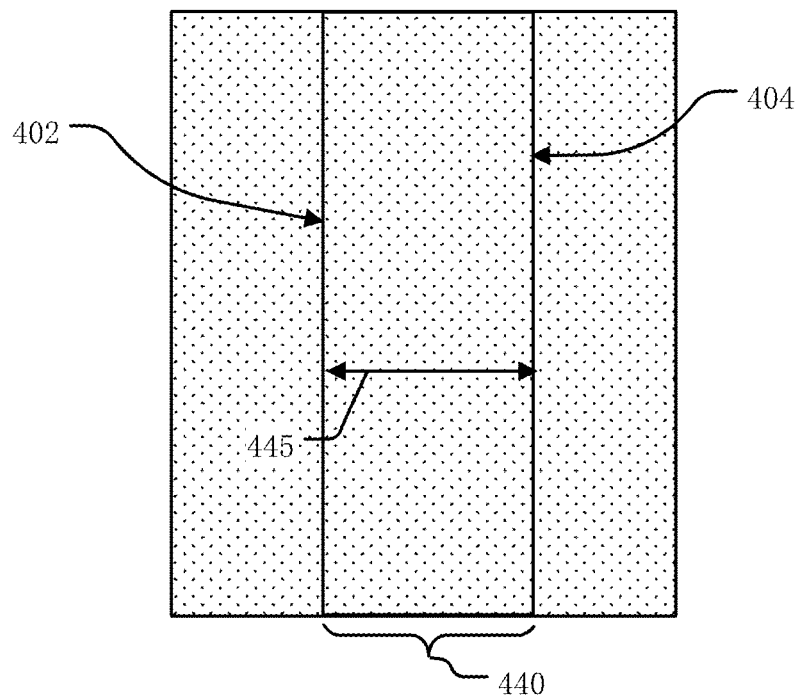
Figure 4B:
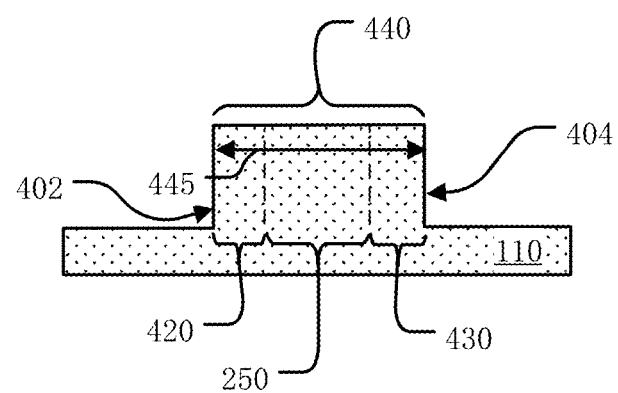

An epitaxial process is then performed on the structure illustrated in FIGS. 3A and 3B to grow additional crystalline phase material on the material layer 110, resulting in the structure illustrated in the top and cross-sectional views of FIGS. 4A and 4B (collectively "FIG. 4"). In the illustrated example, the additional crystalline phase material that is grown is the same material as that of the material layer 110. For example, in one embodiment, the material layer 110 is silicon, and the additional material that is grown is also silicon.

Alternatively, the additional crystalline phase material that is grown is different than the material of the material layer 110. For example, in one embodiment, the material layer 110 is silicon, and the additional material that is grown is germanium. The additional crystalline phase material may have the same type of crystal lattice structure as the material of the material layer 110, or it may be different.

The epitaxial process and the corresponding process parameters can vary from embodiment to embodiment. In some embodiments, the epitaxial process is carried out using solid-phase epitaxy (SPE), vapor-phase epitaxy (VPE), molecular-beam epitaxy (MBE) or liquid-phase epitaxy (LPE).

The material layer 110 serves as a template for crystal growth during the epitaxial process. As a result, in embodiments in which the additional crystalline phase material has the same type of crystal lattice structure as the material of the material layer 110, regions of the epitaxial layer have the same crystallographic orientation as the corresponding surfaces of the material layer 110 on which the regions are grown.

The epitaxial process forms an epitaxial region 420 of crystalline phase material on the etched sidewall surface 202 of the line of material 150. As described in more detail below with respect to FIGS. 5, 6 and 7, the epitaxial region 420 acts to straighten the etched sidewall surface 202 along a surface parallel to a plane of the crystal lattice of the material layer 110, thereby defining a straightened sidewall surface 402. This straightening occurs through crystalline growth of the epitaxial region 420 at energetically favorable step or kink sites which define the roughness of the etched sidewall surface 202. During the epitaxial process, atoms are more likely to bond at these energetically favorable sites, as compared to atoms on an already flat crystal surface along the particular crystal plane. This tends to advance crystalline growth along the particular plane, which in turn causes the straightening of the sidewall surface 402. The straightening depends on the duration of the epitaxial process, as well as which plane of the crystal lattice the straightened sidewall surface 402 extends along. In embodiments, the crystal orientation of the surface 402 is selected such that its epitaxial growth rate is slower than the growth rates of all other crystal orientations. In such a case, parts of the surface that deviate from the straight surface will grow faster than the already straight parts of the surface, effectively providing negative feedback and self-straightening of the surface.

As shown in FIGS. 4A and 4B, the variation in the straightened sidewall surface 402 is much less than the variation in the etched sidewall surface 202, and thus much less than the variation in the sidewall surface 102 of the mask element 100. In other words, the straightened sidewall surface 402 is much straighter than the sidewall surface 102 of the mask element 100 from which the straightened sidewall surface 402 originated.

The epitaxial process also forms an epitaxial region 430 of crystalline phase material on the etched sidewall surface 204 of the line of material 150. Similar to the discussion above, the epitaxial region 430 acts to straighten the etched sidewall surface 204, thereby defining a straightened sidewall surface 404. As a result, the straightened sidewall surface 404 is much straighter than the sidewall surface 104 of the mask element 100 from which the straightened sidewall surface 404 originated.

Although not illustrated, the epitaxial process will also generally form epitaxial regions on the top surface of the etched line 250, as well as the top surfaces of the material layer 110 adjacent the sidewall surfaces 202, 204. If desired, this can be prevented by covering the horizontal surfaces with an amorphous mask such as an oxide or nitride and performing selective epitaxy, where polycrystalline material formed on the amorphous surface is removed during the epitaxy.

The straightened sidewall surface 402 and the straightened sidewall surface 404 define opposing sides of a line 440 of crystalline phase material. The line 440 has a line width 445. The line width 445 may be for example 15 nm, or less.

As a result of the straightening during the epitaxial process, the variation in the straightened sidewall surfaces 402, 404 of the line 440 can be controlled over a distribution much less than the variation in the sidewall surfaces 102, 104 of the mask element 100. These small variations arise because the straightened sidewall surfaces 402, 404 have variations dependent upon the straightening through crystalline growth at energetically favorable atomic step or kink sites, which can be readily controlled. As a result, these variations in the straightened sidewall surfaces 402, 404 can be controlled over a distribution much less than the variations due to photolithographic processes, or other patterning processes, involved in the formation of the sidewall surfaces 102, 104 of the mask element 100. This results in the line 440 having improved line definition, with straighter sidewall surfaces 402, 404, than is possible using conventional techniques. Therefore, integrated circuit elements, such as FinFET transistors, interconnect lines, memory cells, or other small features such as nano-wires, implemented using the line 440 will exhibit uniform performance and high yield in a way not possible in the prior art.

As an example, using a lithographic process, the LER of the sidewall surface 102 and the sidewall surface 104 of the mask element 100 can be greater than 4 nm. As explained above, variations in the straightened sidewall surfaces 402, 404 of the line 440 are substantially less than that of the variations in the sidewall surfaces 102, 104. As a result, the LER of the straightened sidewall surfaces 402, 404 is much smaller, such as for example less than or equal to 1 nm. This results in the width 445 of the line 440 having a LWR substantially less than that of the mask element 100, such as for example less than or equal to 1.5 nm.

In some embodiments the sidewall surfaces 402, 404 vary by +/− the atomic step size of the material of the epitaxial regions 420, 430. In one embodiment in which the epitaxial regions 420, 430 are silicon, the variation is the atomic step size of silicon, +/−0.3 nm.

FIGS. 5A-5F illustrate an example of a cross-sectional view of the straightening of an etched sidewall surface of a line 510 of crystalline phase material.

Figure 5A:
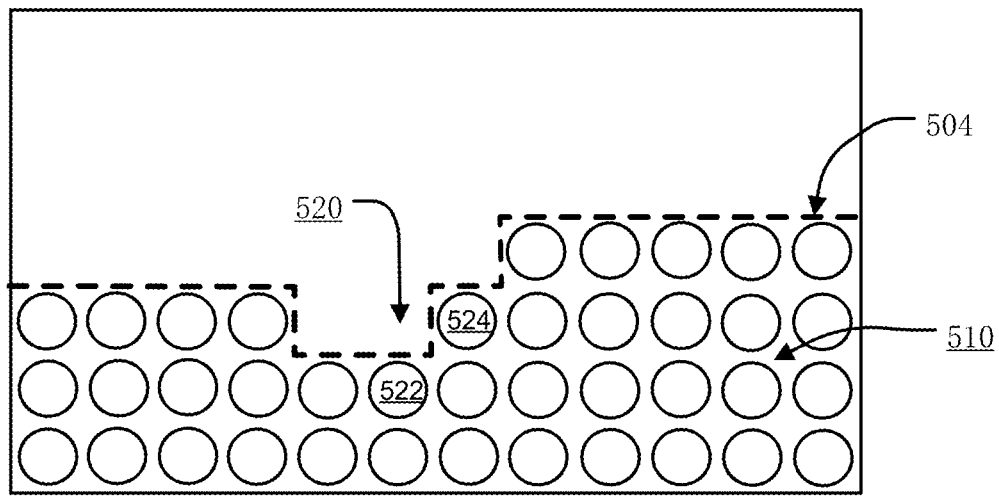
FIGS. 5A, 5B, 5C, 5D, 5E and 5F illustrate an example of the epitaxial growth process for straightening the etched sidewall surface of a line through deposition of material at energetically favorable step or kink sites of the sidewall surface.

FIG. 5A illustrates a cross-sectional view after etching a layer of crystalline phase material using a mask element to form the line 510. The line 510 has a sidewall surface 504, represented by a dashed line in the Figure, having a roughness defined by the atoms arranged in a crystal lattice within the line 510. The type of crystal lattice depends on the material of the line 510. In one embodiment, the atoms are silicon atoms arranged in a diamond cubic crystal structure. Materials having other types of crystal lattices structures may alternatively be used.

As shown in FIG. 5A, the sidewall surface 504 includes kink sites which define the roughness of the sidewall surface 504. A kink site is a location along the sidewall surface 504 where two or more atoms in the crystalline phase region 510 may be bonded with a single atom. For example, kink site 520 is the location where atom 522 and atom 524 may be bonded together by a single atom. The kink sites are energetically favorable sites for crystalline growth because it is more difficult to bond an atom on an already flat crystal surface. An atom which bonds to a flat surface will include several dangling bonds, which causes the total energy of the atom to be relatively high. In contrast, an atom which bonds to a kink site will have less dangling bonds than if it were to attach to a flat surface, and thus a lower total energy. As a result, during an epitaxial process, atoms will preferentially bond at these energetically favorable kink sites, which advances crystalline growth along a crystal plane of the material of the line 510. This in turn causes the straightening of the sidewall surface 504.

Figure 5B:
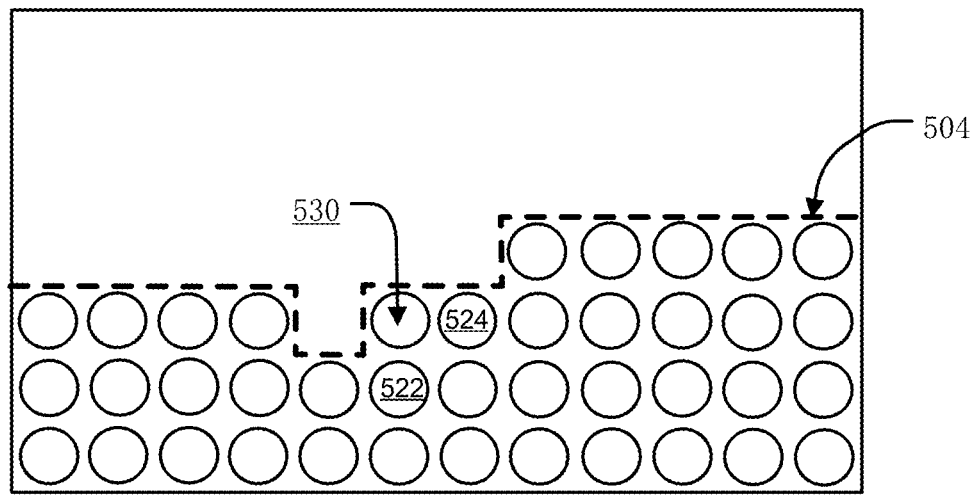
Figure 5C:
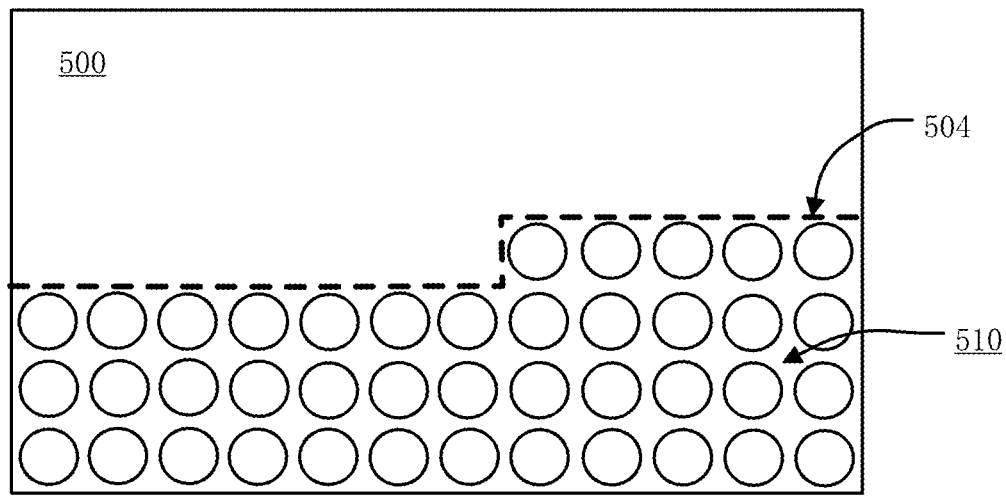
Figure 5D:
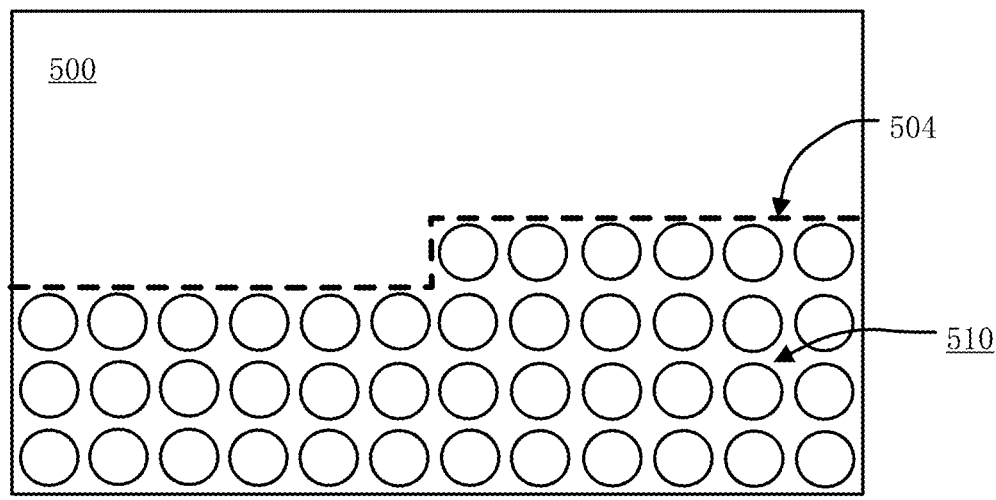
Figure 5E:
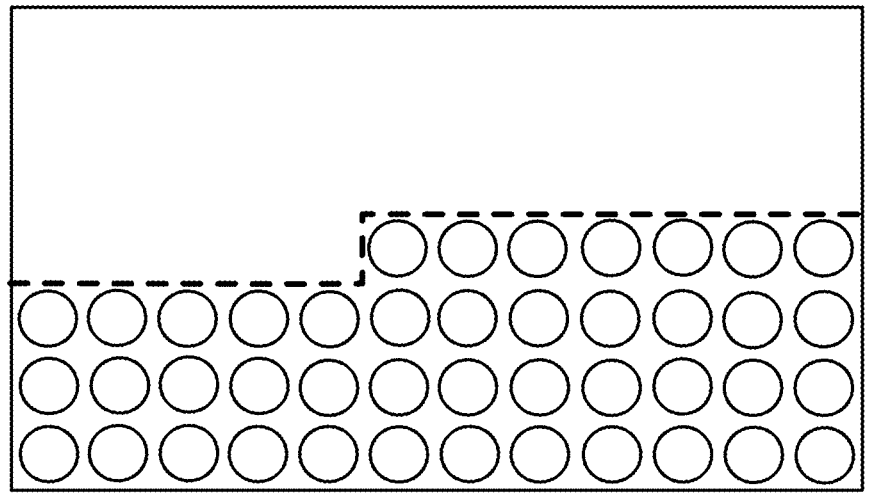
Figure 5F:
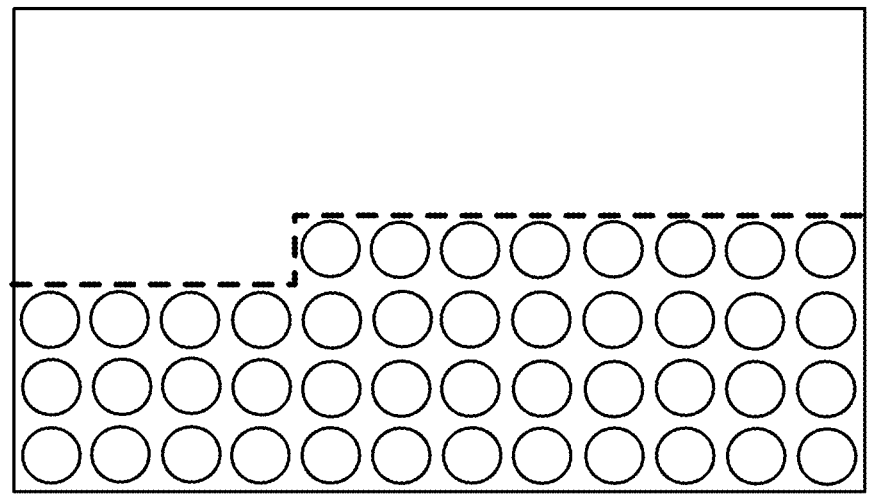

FIG. 5B illustrates a stage in the progression of the straightening of the sidewall surface 504 during the epitaxial process. As shown in FIG. 5B, an atom 530 provided by the epitaxial process bonds to the atoms 524 and 522 in the line 510, thus recrystallizing at the kink site. As can be seen upon comparison of FIGS. 5A and 5B, this causes a shift in the sidewall surface 504.

FIGS. 5C, 5D, 5E and 5F illustrate further stages in the progression of the straightening of the sidewall surface 504 during the epitaxial process. As shown in these figures, additional atoms provided by the epitaxial process continue to bond at available kink sites, thus causing the sidewall surface 504 to advance and straighten.

Figure 6A:
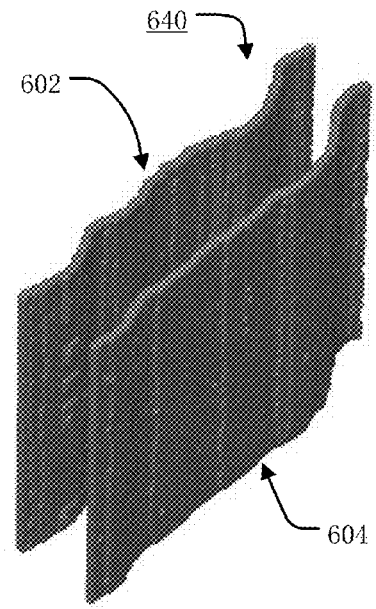
FIGS. 6A, 6B, 6C, 6D, 6E, 6F, 6G, 6H, 6I and 6J illustrate example simulations of the epitaxial growth process.
Figure 6B:
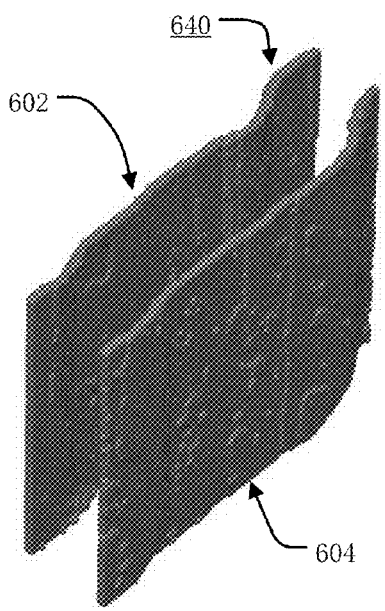

FIGS. 6A-6D illustrate perspective views of a simulation of the straightening of sidewall surfaces 602, 604 of an etched line 640 of crystalline phase material during an epitaxial process. The sidewall surfaces 602, 604 define opposing sides of the line 640. The material of the line 640 between the sidewall surfaces 602, 604 is not shown in the Figures. The simulation can be made using a simulator such as the Sentaurus tools available from Synopsys, Inc. A Lattice Kinetic Monte Carlo model is used for this simulation, and each silicon atom on the surfaces 602, 604 are shown in FIGS. 6A-6B as a separate sphere.

In this example, the line 640 is etched in a silicon wafer with a (100) orientation. The sidewall surfaces 602, 604 are then straightened along a surface parallel to a {111} plane during the epitaxial process.

FIG. 6A illustrates a perspective view after etching the layer of crystalline phase material using a mask element to form the line 640. FIG. 6B illustrates a stage in the progression of the straightening of the sidewall surfaces 602, 604 during the epitaxial process. As can be seen upon comparison of FIGS. 6A and 6B, the epitaxial process causes the sidewall surfaces 602, 604 to straighten.

Figure 6C:
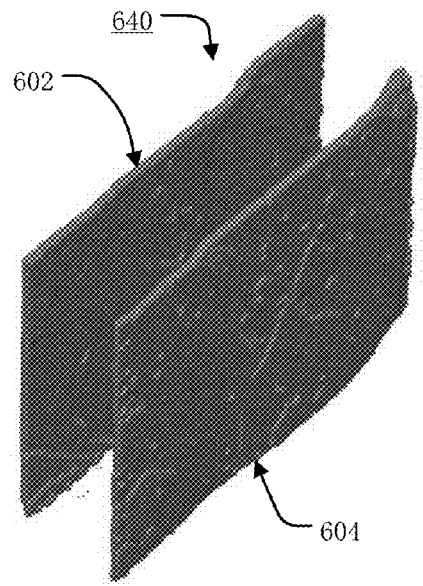
Figure 6D:
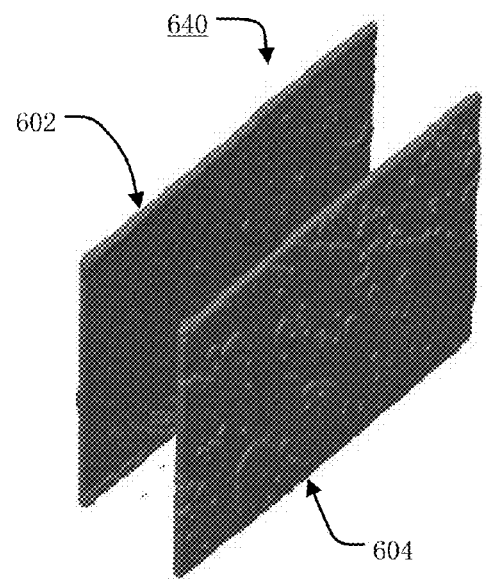

FIGS. 6C and 6D illustrate further stages in the progression of the straightening of the sidewall surfaces 602, 604 during the epitaxial process. As shown in these figures, additional atoms provided by the epitaxial process cause the sidewall surface 602, 604 to continue to straighten.

In this example, FIG. 6B shows the progression one minute after beginning the epitaxial process. FIG. 6C shows the progression after four minutes, and FIG. 6D shows the progression after ten minutes. The epitaxial growth and thus the resulting straightening after certain periods of time depends on the epitaxial process and the corresponding process parameters, which can vary from embodiment to embodiment.

FIGS. 6E-6H illustrate top views of the straightening of sidewall surfaces 602, 604 of an etched line 640 for the respective perspective views in FIGS. 6A-6D.

Figure 6E:
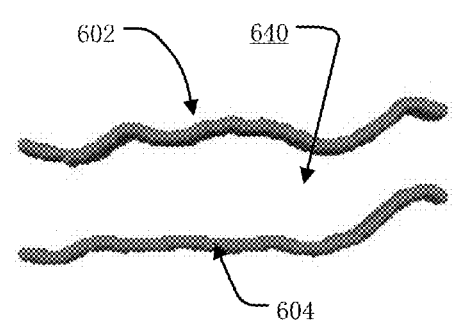

In this example, the etched line 640 as illustrated in FIGS. 6A and 6E has an initial average line width (or critical dimension) of 10.0 nm, and an LWR of 3.09 nm.

Figure 6F:
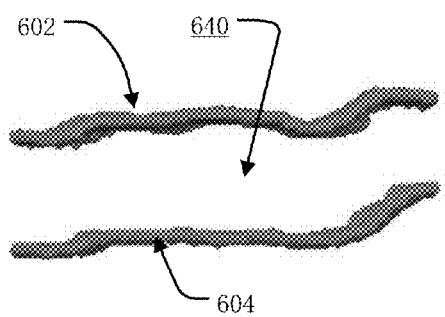
Figure 6G:
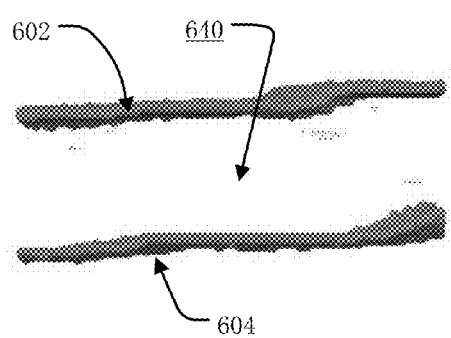
Figure 6H:
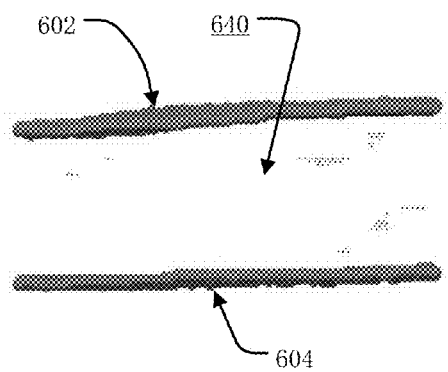

After performing the epitaxial process for one minute, the etched line 640 as illustrated in FIGS. 6B and 6F has an average line width of 11.2 nm, and an LWR of 2.44 nm. After performing the epitaxial process for four minutes, the etched line 640 as illustrated in FIGS. 6C and 6G has an average line width of 13.2 nm, and an LWR of 1.73 nm. After performing the epitaxial process for ten minutes, the etched line 640 as illustrated in FIGS. 6D and 6H has an average line width of 15.4 nm, and an LWR of 1.51 nm.

Thus, in this example the epitaxial process causes the LWR of the line 640 to be reduced by more than half. The increase in the line width during the epitaxial process can be compensated for by reducing the size of the mask used to initially etch the line 640, and/or by also performing a subsequent etching process as described below with reference to FIGS. 8-9, so that the straightened line can have the desired line width.

Figure 6I:
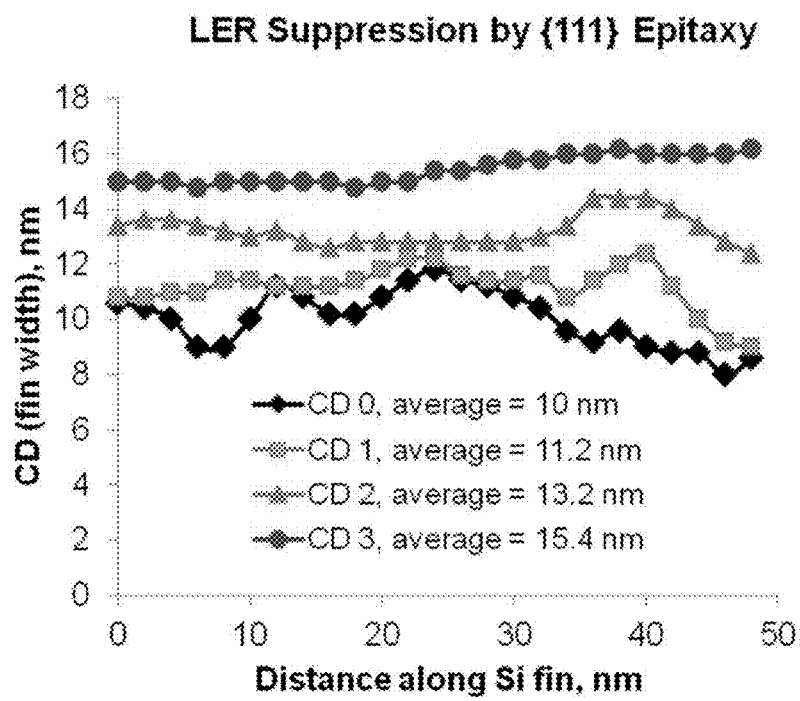

FIG. 6I is a plot of the simulated width of the line 640 between the sidewall surfaces 602, 604 along the length of the line 640 for the simulated results shown in FIGS. 6A-H. The initial line width is labeled "CD 0, average=10 nm" in FIG. 6I. The line width after one minute of the epitaxial process is labeled "CD 1, average=11.2 nm", after four minutes is labeled "CD 2, average=13.2 nm", and after ten minutes is labeled "CD 2, average=13.2 nm". As can be seen in FIG. 6I, the epitaxial growth process acts to suppress the high frequency components of the line width.

Figure 6J:
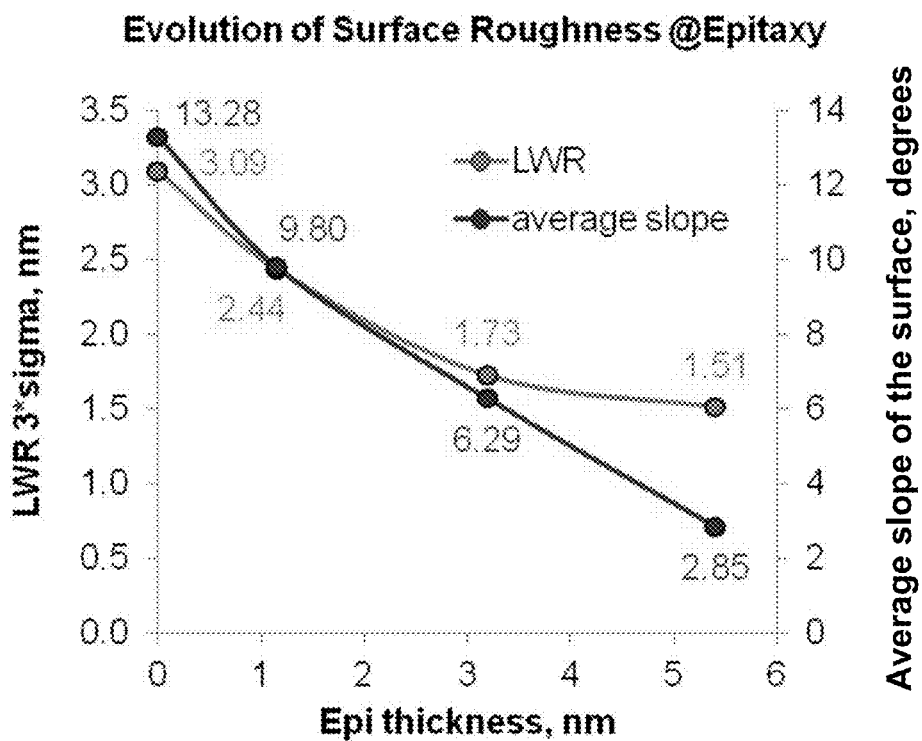

FIG. 6J is a plot of the simulated LWR versus the thickness of the epitaxial regions formed on the sidewall surfaces 602, 604 during the epitaxial process. As can be seen in FIG. 6J, as the epitaxial process continues, which corresponds to an increase in the thickness of the epitaxial regions, the LWR and the average slope of the sidewall surfaces 602, 604 significantly decreases.

Figure 7:
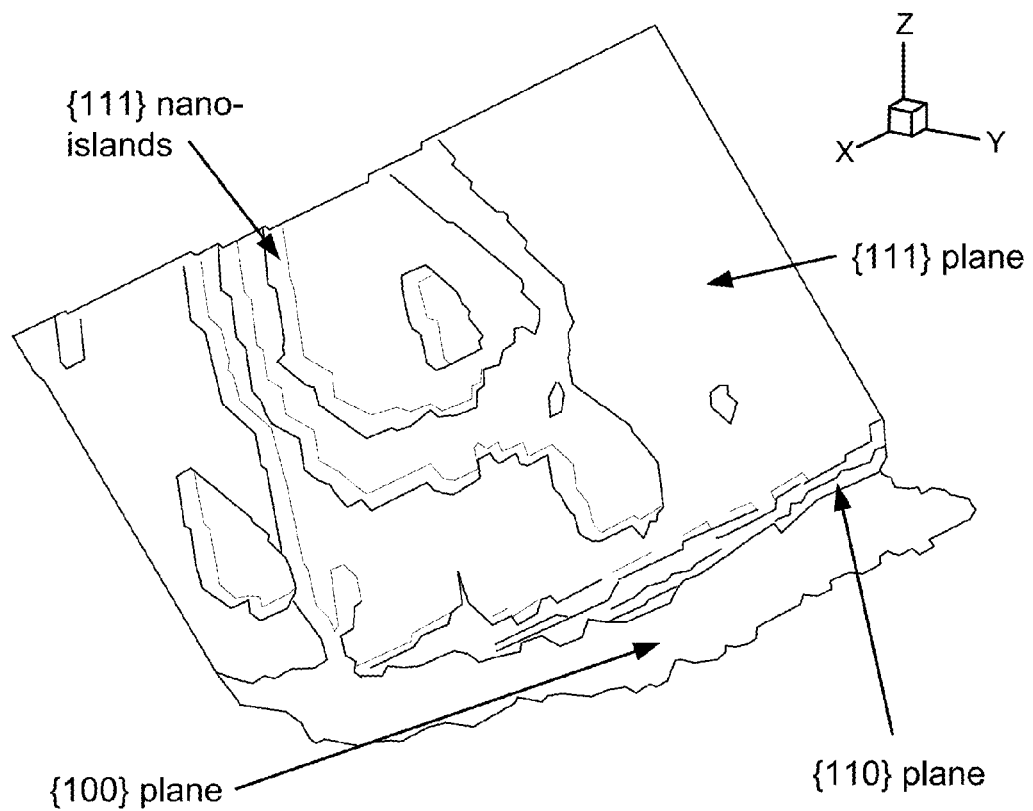
FIG. 7 illustrates an example simulation of the epitaxial growth process for various surfaces along different planes of a crystal lattice for a material having a diamond cubic crystal structure.

FIG. 7 illustrates an example simulation of the epitaxial growth process for various surfaces along different planes of a crystal lattice for a material having a diamond cubic crystal structure. In this example, the material is silicon.

As can be seen in FIG. 7, the roughness of the sidewall surface depends upon which plane of the crystal lattice the sidewall surface extends along. Thus, in some embodiments, the mask element and the material layer are arranged such that the straightened sidewall surface extends along a surface parallel to the plane of the crystal lattice of the material layer which will be the straightest following the epitaxial process.

As shown in FIG. 7, the {111} planes are the straightest after the epitaxial process for material having the diamond cubic crystal structure, the {110} planes are the next straightest, and the {100} planes are the least straight. This variation in the straightness among the various planes occurs because a surface along the {111} planes has the slowest epitaxial growth rate and a surface along the {100} planes has the fastest epitaxial growth rate. In other words, on a {111} plane, the probability that an atom will attach to a flat surface is lower than the probability that an atom will attach to a flat surface on a {100} plane. Thus, in one embodiment in which the material layer comprises a material having a diamond cubic crystal structure, such as silicon, the top surface of the material layer is along a (110) plane, and the straightened sidewalls are formed along a {111} plane of the diamond cubic crystal structure.

In the example described above, the epitaxial process was carried out to straighten the sidewall surfaces extending along the longer sides of an elongated line of material. The techniques described above can also be carried out to simultaneously straighten the sidewall surface along the shorter side (e.g. the end) of the elongated line of material, in order to sharpen the corners between the longer and shorter sides. This results in a line of material having improved line definition, with straighter sidewall surfaces and sharper corners at the intersection of the sidewall surfaces, than is possible using conventional lithographic etch mask technologies.

The corner rounding radius is the radius of a 90-degree arc of a hypothetical circle having a mean position along the intersection between generally perpendicular sides of a line. As an example, using a lithographic process, the corner rounding radius of an etched line can be greater than 50 nm. Using the techniques described herein to form a straightened line, the corner rounding radius can for example be less than 3 nm.

As described above, the roughness of a straightened sidewall surface after the epitaxial process depends on which plane of the crystal lattice the sidewall surface extends along. Thus, in preferred embodiments, the pair of sidewall surfaces which define opposing sides of a line extend along a surface parallel to one plane of the crystal lattice of the material layer, and the sidewall surface at the end of the line extends along a second surface parallel to another plane of the crystal lattice of the material layer. In one embodiment in which the material layer is a material having a diamond cubic crystal structure, the pair of sidewall surfaces extend along a surface parallel to one of a {111} plane and a {110} plane of the diamond cubic crystal structure, and the sidewall surface at the end of the line extends along a surface parallel to the other of the {111} plane and the {110} plane.

In the examples described above, the epitaxial process was preferably carried out to form sidewall surfaces of the line of material extending along particular planes of the crystal lattice of the material layer 110 which are straightened during the process. However, in some devices, other considerations such as stress engineering, carrier mobility, and surface charges/traps may make it undesirable to implement certain integrated circuit elements using a line of material oriented along these particular planes. For example, certain integrated circuit elements may typically be formed in silicon using a {100} wafer with a <110> transistor direction.

As used herein, a wafer orientation is defined by its normal direction, and currently the {100} family of directions is standard in semiconductor fabrication. Because of a crystallographic symmetry, all the specific directions in the {100} family have the same epitaxial growth and etching properties. Whereas a family of wafer orientation directions is denoted herein with curly brackets, if a specific direction is referenced herein, it is enclosed in parentheses, such as (100). Most modern lithographic processes orient all transistors such that their longitudinal direction is the <110> family of crystallographic directions. As used herein, the "longitudinal" direction of a transistor is the direction parallel to current flow in the transistor, and the "transverse" direction of a transistor is the direction cross-wise to the current flow in the transistor. A family of lithographic orientation directions is denoted with angle brackets, whereas if a specific direction is referenced herein, it is enclosed in square brackets, such as [110].

The techniques described herein can also be carried out to form a line of material that can then be used as an etch mask during the patterning of an underlying layer of material. In doing so, a line having straight edges and sharp corners can be formed in the underlying layer, without being limited to particular orientations within the underlying layer. This results in the line in the underlying layer having improved line definition, while also enabling other factors such as stress effects to be taken into consideration when determining the orientation of the sidewall surfaces of the line.

Various types of integrated circuit devices, such as Fin-FET transistors, interconnect lines, memory cells or other small features such as nano-wires, may be implemented using the line in the underlying layer.

In addition, the line may be implemented as part of a mask pattern (or reticle) utilized during manufacturing of subsequent devices. As another example, the line in the underlying layer may be implemented as part of a nanoimprint master template used to form replica nanoimprint masks, sometimes also referred to as stamps or templates. These replica nanoimprint masks are then utilized during nanoimprint lithography to manufacture subsequent devices. In doing so, straight lines and sharp corners can be defined in a material layer during the nanoimprint lithography process, without being limited to particular orientations of the material layer.

FIGS. 8-9 illustrate stages in a manufacturing process flow of a second embodiment for straightening an etched sidewall surface of a line of crystalline phase material.

Figure 8A:
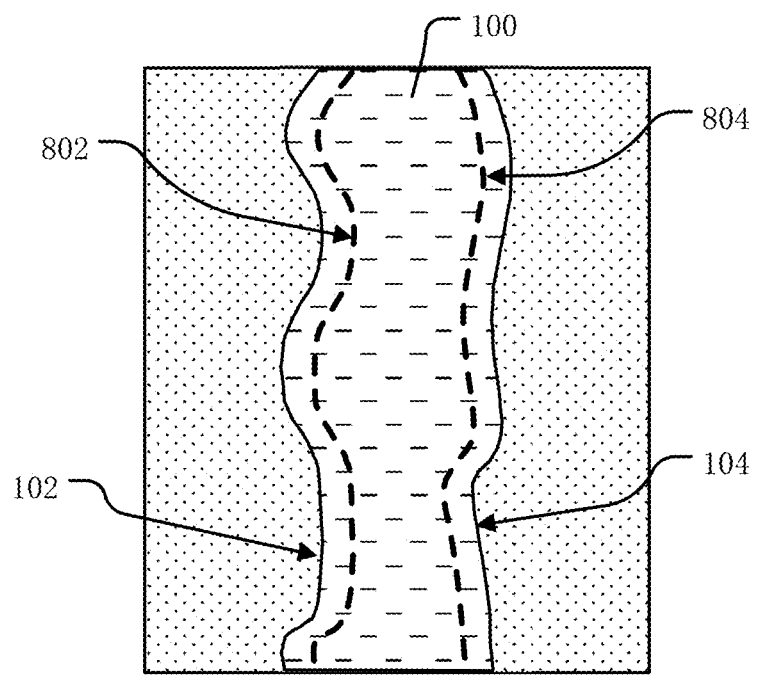
FIGS. 8A, 8B, 9A, and 9B illustrate stages in a manufacturing process flow of a second embodiment for straightening an etched sidewall surface of a line of crystalline phase material.
Figure 8B:
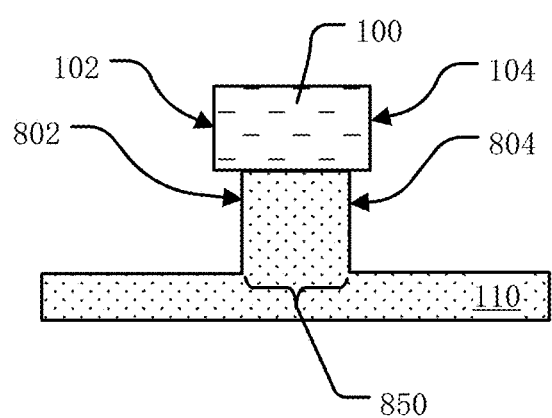

A first etching process is performed on the structure illustrated in FIGS. 1A and 1B using the mask element 100 as an etch mask, resulting in the structure illustrated in the top and cross-sectional views of FIGS. 8A and 8B (collectively "FIG. 8"). The first etching process used depends on the material of the material layer 110, and can vary from embodiment to embodiment. In one embodiment in which the material layer 110 is silicon, the first etching process is performed using reactive ion etching.

The first etching process forms an etched sidewall surface 802 in the material layer 110 at a location defined by the sidewall surface 102 of the mask element 100. Similarly, the etching process forms an etched sidewall surface 804 in the material layer 110 at a location defined by the sidewall surface 104 of the mask element 100. The sidewall surface 802 and the sidewall surface 804 define opposing sides of a line 850 of crystalline phase material in the material layer 110.

As shown in FIGS. 8A and 8B, the variation in the respective sidewall surfaces 802, 804 of the mask element 100 are carried through to the sidewall surfaces 802, 804 in the material layer 110. Due to undercutting by the etching process, the sidewall surfaces 802, 804 each extend a distance beneath the mask element 100 to define the line 850.

As described in more detail below, the mask element 100 and the material layer 110 are arranged such that the etched sidewall surfaces 802, 804 extend along a surface generally parallel to a specific crystal plane of the crystal lattice of the material layer 110. This specific crystal plane has a relatively slow etch rate for a subsequent etching process, as compared to other planes of the crystal lattice. The relatively slow etch rate is then utilized to straighten the etched sidewall surfaces 802, 804 along the particular crystal plane during the subsequent etching process.

The specific crystal plane may be the plane of the material of the material layer 110 having the slowest etch rate for the subsequent etching process. For example, in silicon, the {111} plane, which is densely packed and has a single dangling-bond per atom, has a substantially slower etch rate than other planes for various wet-etch chemistries such as potassium hydroxide (KOH), tetramethylammonium hydroxide (TMAH) and ethylene diamine pyrocatechol (EDP).

Figure 9A:
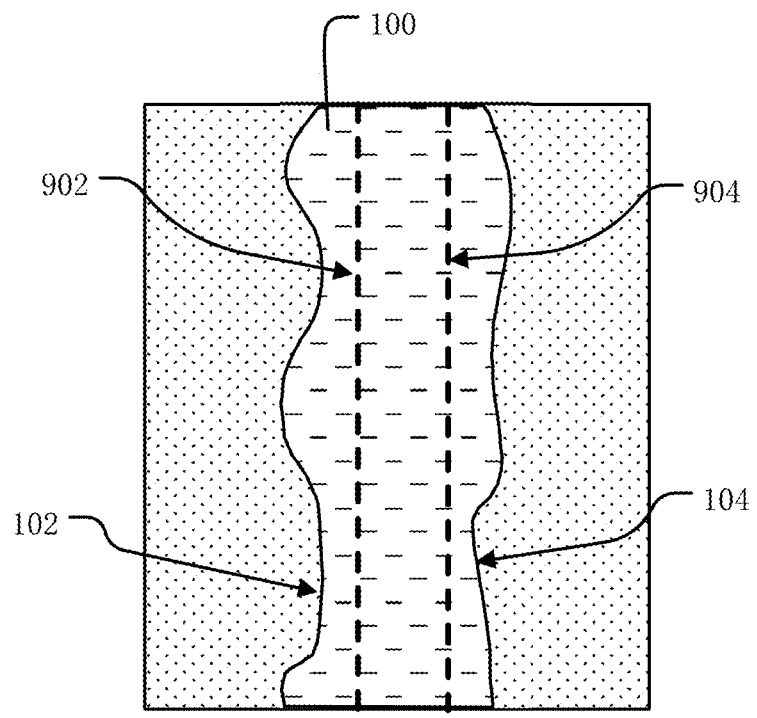
Figure 9B:
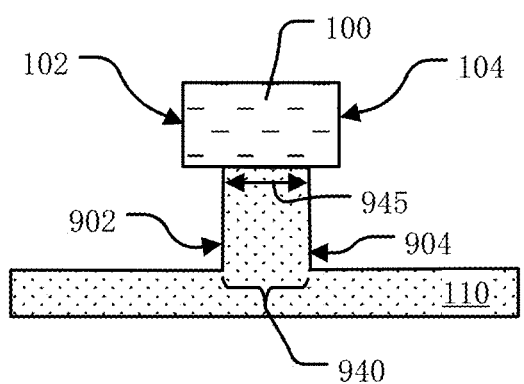

Next, the subsequent etching process is performed on the structure illustrated in FIGS. 8A and 8B to etch away additional material of the etched sidewall surfaces 802, 804, resulting in the structure illustrated in the top and cross-sectional views of FIGS. 9A and 9B (collectively "FIG. 9"). Although not illustrated, the subsequent etching process will generally also remove material from the top surfaces of the material layer 110 adjacent to the sidewall surfaces 802, 804. This may be prevented in some embodiments by covering the horizontal surfaces by a mask such as an oxide, nitride, carbon or other material that is insensitive to the particular etching chemistry.

The etch chemistry of the subsequent etching process can vary from embodiment to embodiment. In some embodiments in which the material layer 110 is silicon, the subsequent etching process is performed using KOH, TMAH or EDP.

The subsequent etching process acts to straighten the etched sidewall surface 802 along a surface parallel to the specific crystal plane having a relatively slow etch rate, thereby defining a straightened sidewall surface 902. This straightening occurs through the more rapid removal of atoms at step or kink sites which define the roughness of the etched sidewall surface 802, as compared to the removal of atoms on an already flat crystal surface along the specific crystal plane. The atoms at the kink sites are removed more rapidly because they include a larger number of dangling bonds than the atoms on the already flat crystal surface along the specific crystal plane. As a result, the subsequent etching process causes the straightening of the sidewall surface 902 along a surface parallel to the specific crystal plane. The straightening depends on the duration and etch chemistry of the subsequent etching process, the material of the material layer 110, and which plane of the crystal lattice the straightened sidewall surface 902 extends along.

In one embodiment in which the material layer 110 comprises a material having a diamond cubic crystal structure, such as silicon, the top surface of the material layer 110 is along a (110) plane. The sidewall surface 902 is then straightened along a surface parallel to a {111} plane during the subsequent etching process using KOH.

The subsequent etching process also acts to straighten the etched sidewall surface 804 along a surface parallel to the specific crystal plane, thereby defining a straightened sidewall surface 904. The straightened sidewall surface 902 and the straightened sidewall surface 904 define opposing sides of a line 940 of crystalline phase material. The line 940 has a line width 945. The line width 945 may be for example 15 nm, or less.

As a result of the straightening during the subsequent etching process, the variation in the straightened sidewall surfaces 902, 904 of the line 940 can be controlled over a distribution much less than the variation in the sidewall surfaces 102, 104 of the mask element 100. These small variations arise because the straightened sidewall surfaces 902, 904 have variations dependent upon the selective etching of atoms at step or kink sites, which can be readily controlled. As a result, these variations in the straightened sidewall surfaces 902, 904, can be controlled over a distribution much less than the variations due to photolithographic processes, or other patterning processes, involved in the formation of the sidewall surfaces 102, 104 of the mask element 100. This results in the line 940 having improved line definition, with straighter sidewall surfaces 902, 904, than is possible using conventional lithographic etch mask technologies.

In some embodiments, the epitaxial process described above with reference to FIGS. 1-4, and the etching process described above with reference to FIGS. 8-9, may both be performed to straighten an etched sidewall surface of a line of crystalline phase material. In such a case, one of the epitaxial process and the etching process may first be performed to at least partially straighten the etched sidewall surface. The other of the epitaxial process and the etching process may then be performed on the at least partially straightened sidewall surface. Such an approach can result in less overall growth of the feature size of the straightened line, as compared to only performing the epitaxial process. The epitaxial process and the etching process may also be iteratively performed a number of times.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method for manufacturing a structure, the method comprising:
   forming a mask element using nanoimprint lithography, the mask element overlying a layer of crystalline phase material, the mask element having a first sidewall surface;
   etching the layer using the mask element as an etch mask, thereby forming a second sidewall surface in the layer at a location defined by the first sidewall surface; and
   processing the etched layer to straighten the second sidewall surface.

2. The method of claim 1, wherein the straightened second sidewall surface extends along a surface parallel to a particular crystal plane of a crystal lattice of the layer, and the processing comprises performing an epitaxial process to grow crystalline phase material on the second sidewall surface.

3. The method of claim 2, wherein the particular crystal plane has an epitaxial growth rate that is less than that of one or more other planes of the crystal lattice.

4. The method of claim 3, wherein the particular crystal plane has an epitaxial growth rate that is less than that of all the other planes of the crystal lattice.

5. The method of claim 2, wherein at least below the mask element, the layer has a diamond cubic crystal structure, and the particular crystal plane is a {111} plane of the diamond cubic crystal structure.

6. The method of claim 2, wherein the grown crystalline phase material is the same material as that of the layer of crystalline phase material.

7. The method of claim 2, wherein the grown crystalline phase material is a different material than that of the layer of crystalline phase material.

8. The method of claim 1, wherein the straightened second sidewall surface extends along a surface parallel to a particular crystal plane of a crystal lattice of the layer, and the processing comprises performing an etching process that has an etch rate for the particular plane that is less than that of one or more other planes of the crystal lattice.

9. The method of claim 8, wherein the etching process has an etch rate for the particular crystal plane that is less than that of all other planes of the crystal lattice.

10. The method of claim 9, wherein at least below the mask element, the layer has a diamond cubic crystal structure, and the particular crystal plane is a {111} plane of the diamond cubic crystal structure.

11. The method of claim 1, wherein the first sidewall surface has a first line edge roughness, and the straightened second sidewall surface has a second line edge roughness that is less than the first line edge roughness.

12. The method of claim 11, wherein the first line edge roughness is greater than 4 nm, and the second line edge roughness is less than or equal to 1 nm.

13. The method of claim 11, wherein the straightened second sidewall surface extends along a surface parallel to a {111} plane of the diamond cubic crystal structure.

14. The method of claim 1, wherein:
the mask element has a third sidewall surface;
etching the layer using the mask element further forms a fourth sidewall surface in the layer at a location defined by the third sidewall surface; and
the processing of the etched layer further straightens the fourth sidewall surface.

15. The method of claim 14, wherein the second sidewall surface and the fourth sidewall surface define opposing sides of a line of crystalline phase material.

16. The method of claim 15, wherein the second sidewall surface and the fourth sidewall surface are parallel.

17. The method of claim 15 wherein the line of crystalline phase material has a line width of 15 nm or less.

18. The method of claim 15, wherein after the processing, the line of crystalline phase material has a line width roughness between the second sidewall surface and the fourth sidewall surface that is less than before the processing.

19. The method of claim 15, wherein the line of crystalline phase material has a line width roughness between the second sidewall surface and the fourth sidewall surface that is less than or equal to 1.5 nm.

20. The method of claim 1, wherein the straightened second sidewall surface extends along a surface parallel to a particular crystal plane of a crystal lattice of the layer, and processing the etched layer to straighten the second sidewall surface comprises:
performing one of an etching process and an epitaxial process to at least partially straighten the second sidewall surface; and
performing the other of the etching process and the epitaxial process on the at least partially straightened second sidewall surface, thereby straightening the second sidewall surface.

21. The method of claim 1, further comprising etching a second layer underlying said layer using the straightened second sidewall surface as an etch mask, thereby forming a third sidewall surface in the second layer at a location defined by the straightened second sidewall surface in said layer.

22. The method of claim 1, wherein at least below the mask element, the layer has a diamond cubic crystal structure.

23. A method for manufacturing a structure, the method comprising:
providing a first layer of crystalline phase material;
etching the first layer to form a first sidewall surface in the first layer;
processing the etched first layer to straighten the first sidewall surface; and
forming the structure by nanoimprint using the etched first layer with the straightened first sidewall surface.

24. The method of claim 23, wherein the straightened first sidewall surface extends along a surface parallel to a particular crystal plane of a crystal lattice of the first layer, and the processing comprises performing an epitaxial process to grow crystalline phase material on the first sidewall surface.

25. The method of claim 24, wherein the particular crystal plane has an epitaxial growth rate that is less than that of one or more other planes of the crystal lattice.

26. The method of claim 25, wherein the particular crystal plane has an epitaxial growth rate that is less than that of all the other planes of the crystal lattice.

27. The method of claim 24, wherein etching the first layer to form a first sidewall surface in the first layer comprises:
forming a mask element overlying the first layer, the mask element having a predecessor sidewall surface; and
etching the first layer using the mask element as an etch mask, thereby forming the first sidewall surface in the first layer at a location defined by the predecessor sidewall surface.

28. The method of claim 27, wherein at least below the mask element, the first layer has a diamond cubic crystal structure, and the particular crystal plane is a {111} plane of the diamond cubic crystal structure.

29. The method of claim 24, wherein the grown crystalline phase material is the same material as that of the first layer of crystalline phase material.

30. The method of claim 24, wherein the grown crystalline phase material is a different material than that of the first layer of crystalline phase material.

31. The method of claim 23, wherein the straightened first sidewall surface extends along a surface parallel to a particular crystal plane of a crystal lattice of the first layer, and the processing comprises performing an etching process that has an etch rate for the particular plane that is less than that of one or more other planes of the crystal lattice.

32. The method of claim 31, wherein the etching process has an etch rate for the particular crystal plane that is less than that of all other planes of the crystal lattice.

33. The method of claim 32, wherein etching the first layer to form a first sidewall surface in the first layer comprises:
forming a mask element overlying the first layer, the mask element having a predecessor sidewall surface; and
etching the first layer using the mask element as an etch mask, thereby forming the first sidewall surface in the first layer at a location defined by the predecessor sidewall surface, and wherein at least below the mask element, the first layer has a diamond cubic crystal structure, and the particular crystal plane is a {111} plane of the diamond cubic crystal structure.

34. The method of claim 23, wherein etching the first layer to form a first sidewall surface in the first layer comprises:
forming a mask element overlying the first layer, the mask element having a predecessor sidewall surface; and
etching the first layer using the mask element as an etch mask, thereby forming the first sidewall surface in the first layer at a location defined by the predecessor sidewall surface, and wherein the predecessor sidewall surface has a predecessor line edge roughness, and the straightened first sidewall surface has a first line edge roughness that is less than the predecessor line edge roughness.

35. The method of claim 34, wherein the predecessor line edge roughness is greater than 4 nm, and the first line edge roughness is less than or equal to 1 nm.

36. The method of claim 34, wherein the straightened first sidewall surface extends along a surface parallel to a {111} plane of the diamond cubic crystal structure.

37. The method of claim 23, wherein etching the first layer to form a first sidewall surface in the first layer comprises:
forming a mask element overlying the first layer, the mask element having a predecessor sidewall surface; and etching the first layer using the mask element as an etch mask, thereby forming the first sidewall surface in the first layer at a location defined by the predecessor sidewall surface, and wherein the mask element has a second sidewall surface;

etching the first layer using the mask element further forms a third sidewall surface in the first layer at a location defined by the second sidewall surface; and the processing of the etched layer further straightens the third sidewall surface.

38. The method of claim 37, wherein the first sidewall surface and the third sidewall surface define opposing sides of a line of crystalline phase material.

39. The method of claim 38, wherein the first sidewall surface and the third sidewall surface are parallel.

40. The method of claim 39 wherein the line of crystalline phase material has a line width of 15 nm or less.

41. The method of claim 39, wherein after the processing, the line of crystalline phase material has a line width roughness between the first sidewall surface and the third sidewall surface that is less than before the processing.

42. The method of claim 39, wherein the line of crystalline phase material has a line width roughness between the first sidewall surface and the third sidewall surface that is less than or equal to 1.5 nm.

43. The method of claim 23, wherein the straightened first sidewall surface extends along a surface parallel to a particular crystal plane of a crystal lattice of the first layer, and processing the etched first layer to straighten the first sidewall surface comprises:

performing one of an etching process and an epitaxial process to at least partially straighten the first sidewall surface; and performing the other of the etching process and the epitaxial process on the at least partially straightened first sidewall surface, thereby straightening the first sidewall surface.

44. The method of claim 23, wherein the first layer has a crystal lattice having a first orientation, and wherein forming the structure by nanoimprint using the etched first layer with the straightened first sidewall surface comprises nanoimprinting the etched first layer into a further layer that does not have a crystal lattice with the first orientation.

45. The method of claim 23 wherein etching the first layer to form a first sidewall surface in the first layer comprises:

forming a mask element overlying the first layer, the mask element having a predecessor sidewall surface; and etching the first layer using the mask element as an etch mask, thereby forming the first sidewall surface in the first layer at a location defined by the predecessor sidewall surface.

46. The method of claim 45 wherein at least below the mask element, the first layer has a diamond cubic crystal structure.

* * * * *